Figure 1:
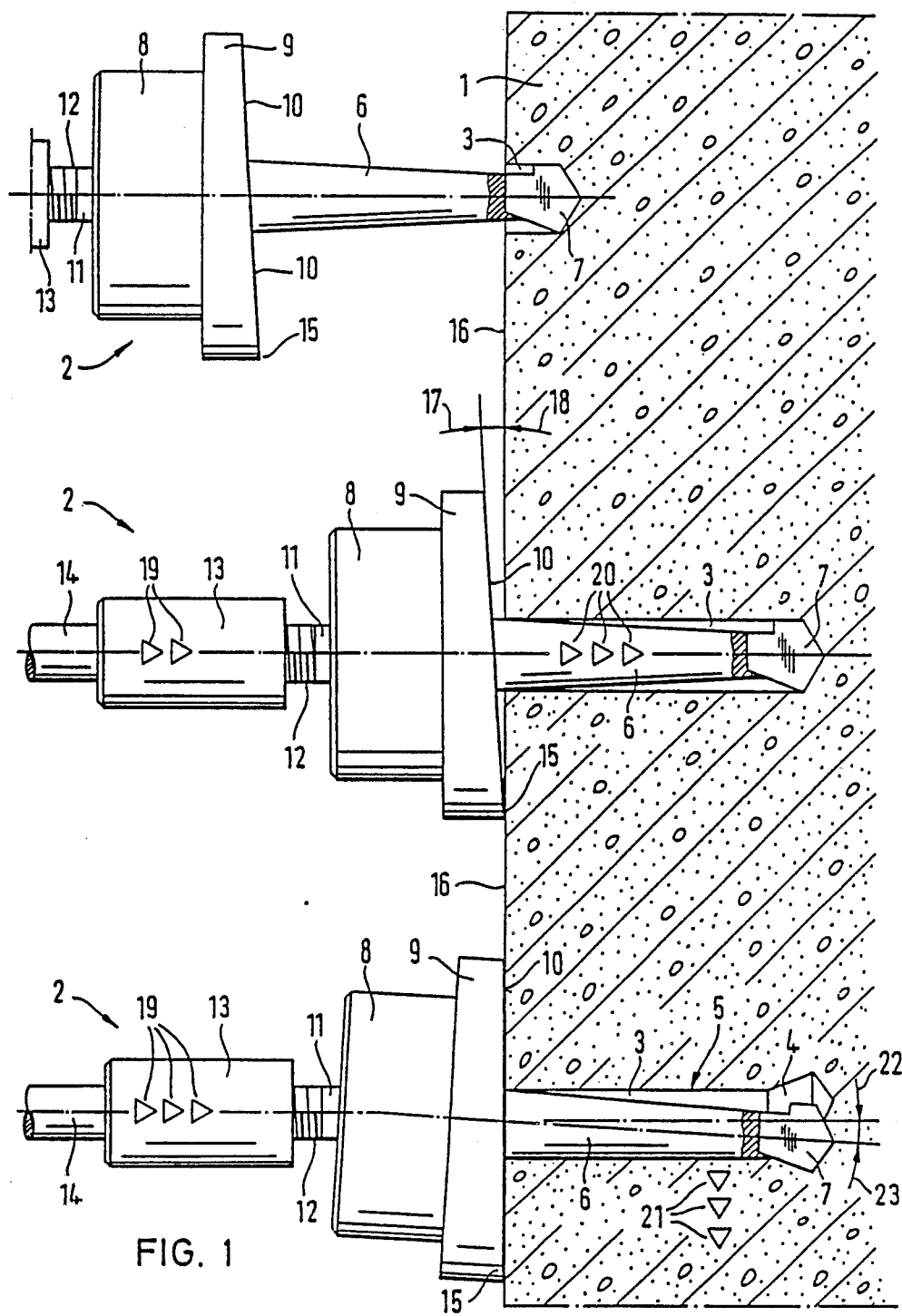

United States Patent [19]

Rinklake et al.

[11] Patent Number: 4,971,486

[45] Date of Patent: Nov. 20, 1990

[54] UNDERCUTTING DRILL

[75] Inventors: Manfred Rinklake, Friedrichsdorf; Paul Steurer, Teningen; Albert Frischmann, Kenzingen, all of Fed. Rep. of Germany

[73] Assignee: Upat GmbH & Co., Emmendingen, Fed. Rep. of Germany

[21] Appl. No.: 381,745

[22] PCT Filed: Feb. 6, 1988

[86] PCT No.: PCT/DE88/00058

§ 371 Date: Jul. 7, 1989

§ 102(e) Date: Jul. 7, 1989

[87] PCT Pub. No.: WO88/06070

PCT Pub. Date: Aug. 25, 1988

[30] Foreign Application Priority Data

Feb. 13, 1987 [DE] Fed. Rep. of Germany ....... 3704491

[51] Int. Cl.$^5$ .......................... B23B 41/00; B23B 51/08
[52] U.S. Cl. ...................................... 408/180; 279/16; 408/127; 408/147
[58] Field of Search .................. 279/16; 408/72 R, 73, 408/113, 127, 147, 150, 180, 187, 223, 227

[56] References Cited

U.S. PATENT DOCUMENTS

| 2,381,102 | 8/1945 | Boyd | 408/127 |
| 2,392,039 | 1/1946 | Gideon . | |
| 4,545,706 | 10/1985 | Hiroyasu et al. | 408/180 |

FOREIGN PATENT DOCUMENTS

| 237405 | 12/1964 | Austria . | |
| 0087085 | 2/1983 | European Pat. Off. . | |
| 1285845 | 12/1968 | Fed. Rep. of Germany | 408/187 |
| 2657000 | 6/1978 | Fed. Rep. of Germany | 408/230 |
| 3027408A1 | 7/1980 | Fed. Rep. of Germany . | |
| 3022464 | 1/1982 | Fed. Rep. of Germany . | |
| 3143462 | 5/1983 | Fed. Rep. of Germany . | |
| 3629562 | 11/1987 | Fed. Rep. of Germany | 408/226 |
| 579528 | 8/1946 | United Kingdom . | |

Primary Examiner—Daniel W. Howell
Attorney, Agent, or Firm—Jeffers, Hoffman & Niewyk

[57] ABSTRACT

An undercutting drill for obtaining a drill hole with a conical undercut. A drill shaft is provided connected in an articulated manner through a housing and containing a universal joint to a clamping shank. The face of the housing facing the joint. The drill shaft is provided with a plate having a stopping face, the vertical centerline of which is tilted in relation to the longitudinal axis of the drill shaft.

10 Claims, 4 Drawing Sheets

UNDERCUTTING DRILL

The invention concerns an undercut drill bit with a mounting arbor, a deflection plate which bears on the borehole rim and on which a shaft with a cutter part is fastened at a slant relative to the plumb on the stop face of the deflection plate.

Such an undercut bit for creating undercuts in predrilled lightweight construction materials is known from the German patent disclosure No. 30 22 464 and serves the preparation of an anchoring of fasteners by form fit in the undercut part of the bore. On the prior device, the cutting part is slanted at a fixed angle relative to the longitudinal axis of the mounting arbor and, thus, the longitudinal axis of the impact drill or drilling machine used. The cutting part is introduced in a previously produced cylindrical bore and the drilling machine or impact drill is turned on with the cutting part stirring about in the cylindrical bore, causing in the case of lightweight construction material a removal of the cylindrical sidewalls. Pivoting the longitudinal axis of the drilling machine or impact drill along the longitudinal axis of the cylindrical bore accomplishes the gradual formation of the conic undercut. In the process, lateral forces are exerted on the shaft of the impact drill and the drilling machine, and on the corresponding bearings of the drilling equipment, which usually do not occur in drilling equipment.

Described in the German patent disclosure No. 30 27 408 is a drilling device for the production of undercut bore holes where the drill bit shaft is mounted fixed and aligned on the longitudinal axis of the drilling apparatus, installed together with the drilling apparatus in a ball joint which permits the pivoting of the drill shaft in a predrilled cylindrical bore hole. In this device, too, the bearings are heavily stressed. Additionally, a longer lever arm involves the risk that the drill shaft will be bent. Finally, the pivoting of the drilling apparatus requires room for maneuvering, which is not always available, so that with the prior device it is not possible, for instance, to drill undercut bore holes in the vicinity of corners and edges.

The problem underlying the invention is to provide an undercut drill bit of the initially mentioned type that makes it possible to produce a conically undercut borehole both in lightweight construction materials and concrete, in a single operation without circular pivoting of the drilling machine or impact drill.

This problem is intentionally solved in that the mounting arbor is connected with the deflection plate through a cardan joint and the drill shaft features on its front end a radially protruding cutting plate as cutting component.

The cardan joint transmits both rotary and axial forces, and a pivoting of the drilling machine or impact drill is no longer necessary because the stop surface of the deflection plate transmits upon contact with the borehole rim a tilting moment to the drill shaft which on account of the cardan joint is not transmitted to the mounting arbor because the cardan joint allows a transmission of force from the mounting arbor to the drill shaft while variable angles can be assumed between the mounting arbor and the drill shaft.

On a suitable embodiment of the invention, the cardan joint is provided in a housing which on its end facing toward the drill shaft is covered with a circular deflection plate which in the form of a wedge tapers in one direction. What is accomplished by this design is that the longitudinal axes of the drill shaft and the mounting arbor are in mutual alignment while the cylindrical part of the borehole is being made.

To avoid damage to the surface around the borehole rim the stop face of the deflection plate may be covered with a plastic plate.

On the end away from the deflection plate, the housing has an opening through which protrudes an entrainment screw which is pivotable in any direction and is permanently connected with the mounting arbor. The entrainment screw features a hex head with a ball-shaped front which is installed in a hex recess in the housing in tiltable fashion and bears with its ball front on the rear end of the drill shaft which is fastened in the deflection plate.

Further suitable designs are characterized in the subclaims.

The invention will be more fully explained hereafter with the aid of embodiments illustrated in the drawing.

Figure 2:
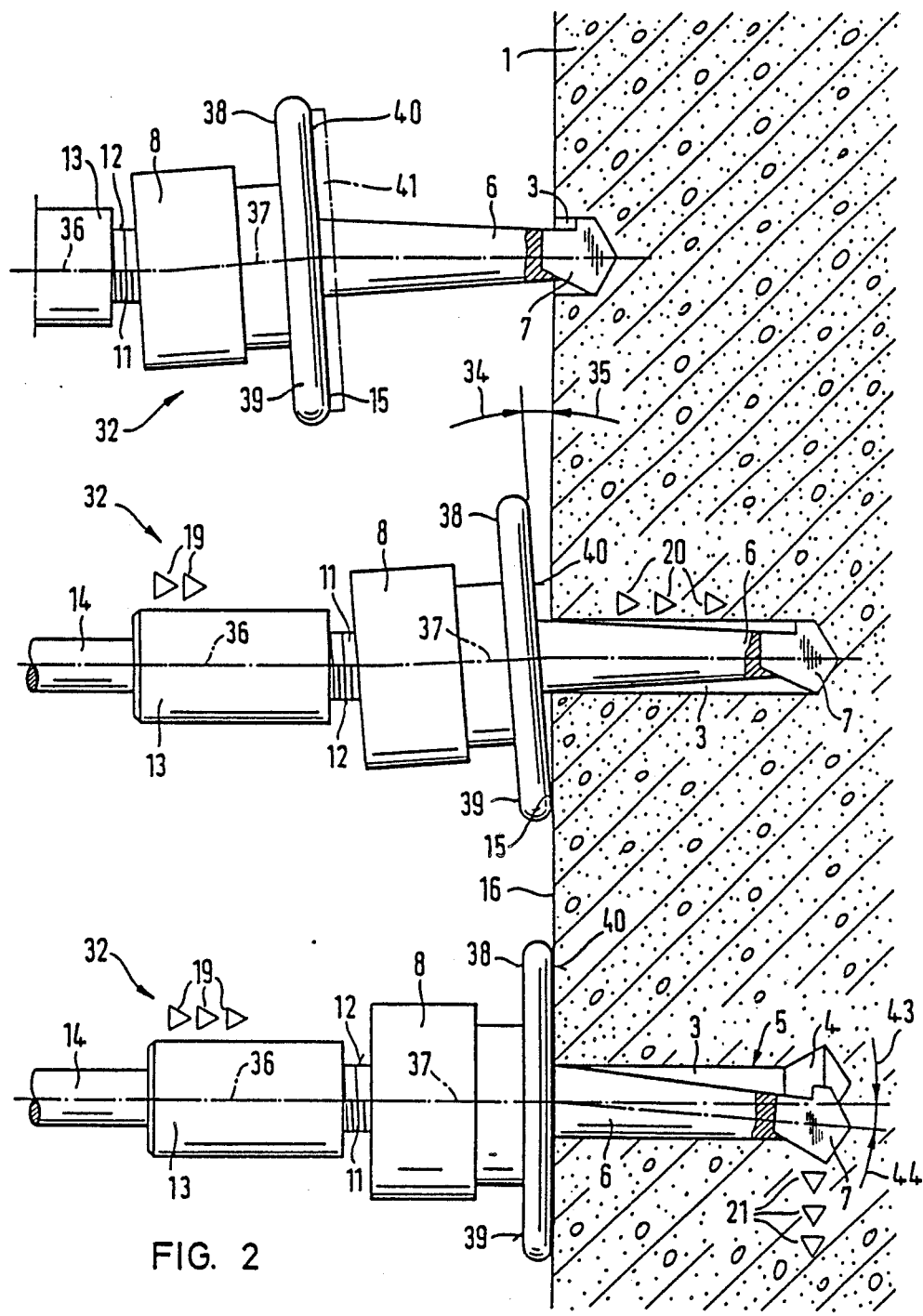
Figure 3:
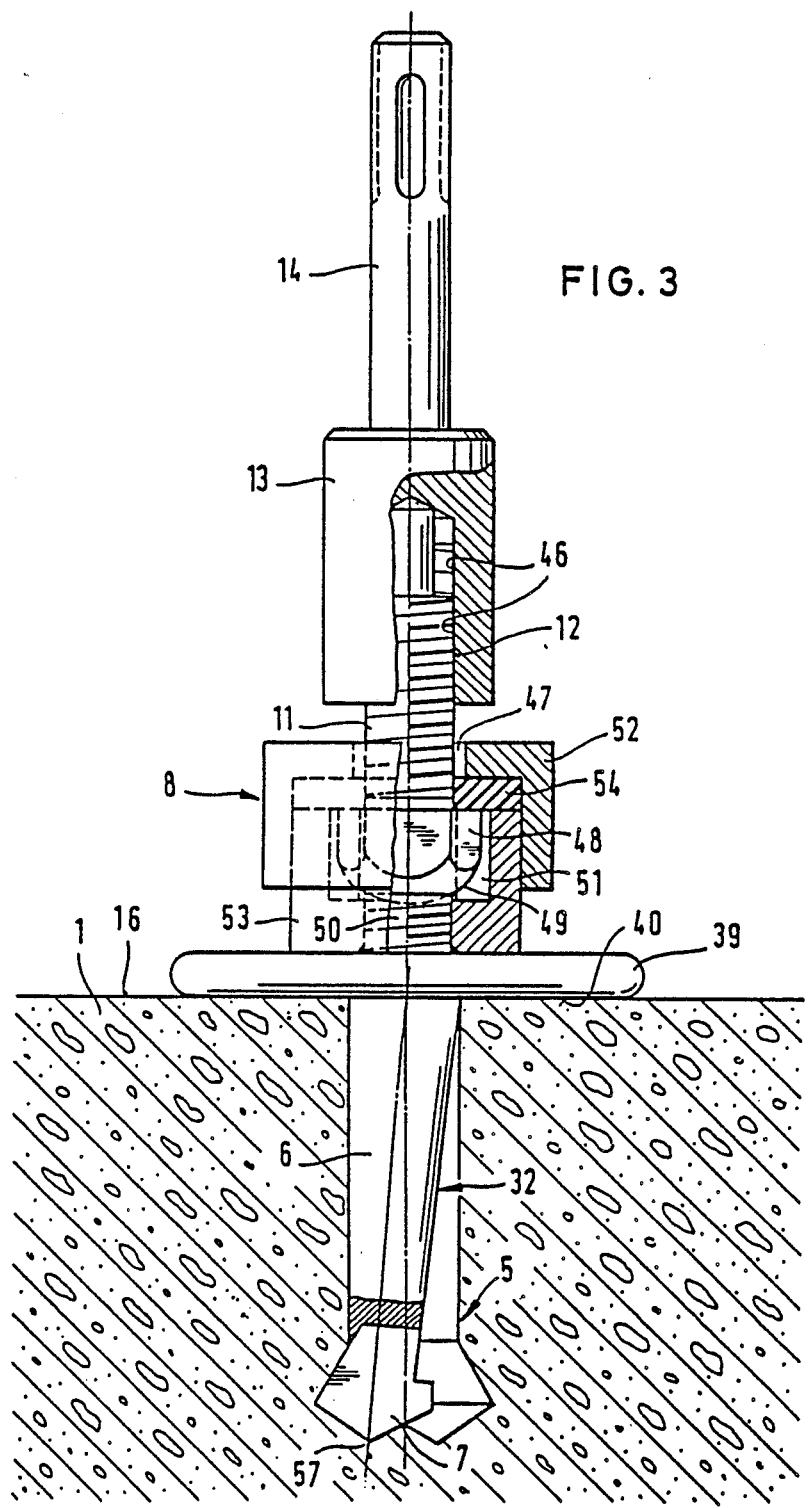
Figure 4:
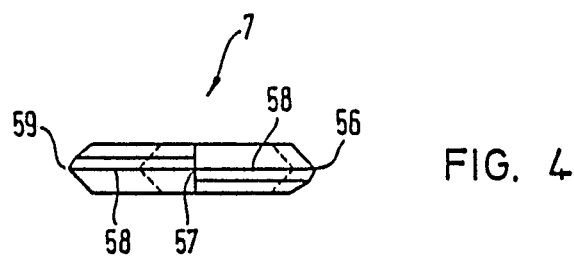
Figure 5:
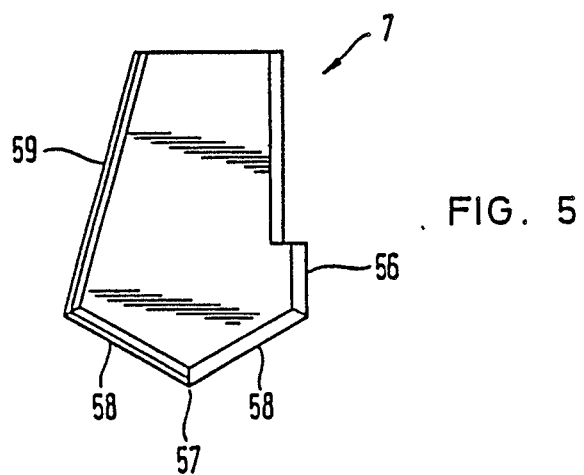

FIG. 1 shows an intentional undercut drill bit in the preparation of a conically undercut borehole in three phases of the operation, in a lateral view with the borehole wall cut open;

FIG. 2, an illustration corresponding to FIG. 1, with an undercut drill whose deflection plate is of uniform thickness;

FIG. 3, an undercut drill bit of the type shown in FIG. 2 in cross section;

FIG. 4, the cutting plate inserted at the front end of the drill shaft in front view;

FIG. 5, the cutting plate in side elevation.

Visible in FIG. 1, on the right-hand side, is a wall 1 that consists of concrete, a lightweight construction material or brickwork. Using the undercut drill bit 2 shown at the left, a cylindrical pilot hole 3 is produced first in the wall 1, as can be seen in FIG. 1, top and center. In FIG. 1, bottom, the undercut drill bit 2 is illustrated together with the undercut produced subsequent to the cylindrical pilot hole 3. Once the form of the pilot hole 3 illustrated in FIG. 1 bottom is obtained with the undercut 4 the undercut drill bit 2 is retracted from the undercut borehole 5 in order to insert a fastener which with its front end causes a form fit in the undercut 4.

The undercut drill bit 2 comprises a shaft 6 which on its front end is provided with a cutting plate 7, the shape of which is described in detail further down with the aid of FIGS. 4 and 5. The cutting plate 7, for one, serves to produce the cylindrical pilot hole 3 and, for another, the production of the conic undercut 4. The cutting plate 7 consists preferably of tungsten carbide.

For removal of the debris, the shaft 6 of the drill bit is provided with helical fluting, which is not illustrated in the drawing. The shaft 6 is rigidly connected with a housing 8 which on its end facing toward the cutting plate 7 features a deflection plate 9 that has a stop face 10 which extends slanted to the longitudinal axis of the drill bit shaft 6. The housing 8 and the deflection plate 9 provided with the slanted stop face 10 have a circular cross section. For adaptation to the impact effect of the impact drill used and the material of the wall, the diameter of the deflection plate 9 may differ and, e.g., may be selected larger for smaller impact drills.

On the end opposite the drill shaft 6, an entrainment screw 11 protrudes out of the housing 8, which screw serves to impart to the drill shaft 6 with the radially protruding cutting plate 7 a rotary impact motion. The entrainment screw 11 has an external threading 12 which is screwed into a tapper holder 13. The latter, in turn, is provided with a mounting arbor 14 serving to mount the undercut drill bit 2 in the tool holder of an impact drill or impact drilling machine, which is not illustrated in the drawing.

In the operation of the impact drill it is possible in the way illustrated in FIG. 1, top, to produce the pilot hole 3, in which process the longitudinal axes of the tapped holder 13 and the entrainment screw 11 are in alignment with the longitudinal axes of the housing 8 and the drill shaft 6. Percussions of the impact drill and thrust forces are this way transmitted together with rotary forces to the cutting plate 7, which penetrates the wall 1 and produces the pilot hole 3 until the position of the stop face 10 of the deflection plate 9 is reached, which is illustrated in FIG. 1, center. As can be seen from FIG. 1, center, the stop face 10 extending slanted to the longitudinal axis of the drill shaft 6 first makes contact with the surface 16 of the wall in a marginal area 15 which is located near the outer circumference. Due to the inclination of the deflection plate 9 by the angle illustrated by arrows 17 and 18, a tilting moment on the deflection plate 9 and the drill shaft 6 rigidly connected with it is generated upon making contact with the marginal area 15 of the surface 16.

As already indicated above, the entrainment screw 11 is connected with the housing 8 in reactionally fixed fashion. But the connection is fashioned as a cardan joint enabling a transfer of force from the mounting arbor 14 which is rigidly connected with the entrainment screw 11 to the drill shaft 6, so that the driven drill shaft 6 can assume a variable angle relative to the driving mounting arbor 14.

Owing to the cardan joint provided in the housing 8, the axially pounding drill forces introduced in the direction of arrows 19, which up until making contact with the marginal area 15 of the surface 16 are transmitted exclusively in the direction of arrow 20, are radially deflected in the direction illustrated in FIG. 1, bottom, by arrows 21 so that, basin on the shape of the cylindrical pilot hole 3 illustrated in FIG. 1, center, the undercut borehole 5 illustrated in FIG. 1, bottom, is produced in that impact and thrust forces are exerted on the cutting plate 7 in the direction of arrows 21 while the deflection plate 9 rotates and makes contact with an ever increasing area of the stop face 10 of the surface 16 until the final condition illustrated in FIG. 1, bottom, is reached where between the longitudinal axis of the mounting arbor 14 and the longitudinal axis of the drill shaft 6 there exists a tilt angle illustrated by arrows 22, 23, which corresponds to the angle of inclination of the stop face 10 of the deflection plate 9.

Illustrated in FIG. 2 is an undercut drill bit 32 whose mode of operation corresponds essentially with that of the undercut drill bit 2 according to FIG. 1. Illustrated in FIG. 2, corresponding with FIG. 1, are the various phases of the operation for producing an undercut borehole 5. Corresponding components in FIG. 2 that have been discussed in conjunction with FIG. 1 are provided with the same reference symbols.

As opposed to the undercut drill 2, the undercut drill bit 32 comprises a deflection plate 39 whose back wall 38 extends parallel to the stop face 40. The same as in the case of the undercut drill bit 2, the longitudinal axis of the drill shaft 6 is slanted relative to the plumb on the stop surface 40. Contrary to the undercut drill bit 2, the longitudinal axes of the housing 8 and of the drill shaft 6 are not in mutual alignment, which can be seen in FIG. 2 top where the longitudinal axis of the housing 8 is referenced 37 and the longitudinal axis of the mounting arbor 14, offset sideways relative to the longitudinal axis of the drill shaft 6, is referenced 36.

Visible in FIG. 2, similar to FIG. 1, is a taper angle illustrated by arrows 34, 35, between the plane of the stop face 40 and the plane of the surface 16 of the wall 1 which extends at a right angle to the longitudinal axis of the borehole.

Once the borehole depth illustrated in FIG. 2, center, is reached, the tilting of the deflection plate 39 begins, and thus the radial deflection of the cutting plate 7 at the tip of the drill shaft 6, with the angle between the longitudinal axis of the mounting arbor 14 and the longitudinal axis of the housing 8 being continuously varied until both axes are in alignment with one another and the longitudinal axis of the drill shaft 6 inscribes together with the aligned axes the angle illustrated in FIG. 1, bottom, by arrows 43, 44. Illustrated in FIG. 2, top, by dash-dot line is an additional plate 41 from plastic which may be provided on the stop face 40 or 10 so as to protect the surface 16 of the wall 1 from damage when if consists of a lightweight construction material.

Illustrated in FIG. 3 is the construction of the undercut drill bit 32, in partial cross section, in a position corresponding to that in FIG. 2, bottom. Identical components are again referenced identically.

Visible in FIG. 3 is the mounting arbor 14 for installing the undercut drill bit 32 in an impact drill or impact drilling machine. Rigidly connected with the mounting arbor 14, the tapped holder 13 comprises an internal threading 46 which is engaged by the external threading 12 of the entrainment screw 11. The latter protrudes through an opening 47 out of the housing 8. As can be seen in FIG. 3, the opening 47 leaves between the external threading 12 and the housing 8 an annular gap so that the entrainment screw 11 can be freely tilted in any direction.

The entrainment screw 11 features a hex head 48 that is of convex design on its front 47 enabling it to exert independently from the tilt angle a thrust force on the end (50) of the drill shaft 6 which protrudes into the housing 8 and in which a concave depression matching the convex boss on the hex head 48 may be provided.

The hex head 48 is contained in a correspondingly shaped hex recess 51 in the housing 8, which in the way deriving from FIG. 3 consists of an upper part 52 and a lower part 53. Provided between the upper part 52 and the lower part 53 is an elastic restoring element 54 onto which the hex head 58 is forced.

As is evident from FIG. 3 the deflection plate 39 is fastened on the bottom part 53 of the housing 8, perpendicular to its longitudinal axis. The drill shaft 6 is tilted relative to the center plump on the deflection plate 39 so as to generate a tilt moment and consequently an undercut 4 as the deflection plate 39 bears on the surface 16.

In FIGS. 4 and 5, the cutting plate 7 is illustrated at larger scale. The cutting plate 7 features a directional cutting edge 56 that extends parallel to the longitudinal axis of the drill shaft 6 and with the aid of which the cylindrical pilot bore 3 is produced. Symmetric on both sides, cutting edges 58 extend forwardly toward the bit point 57. Additionally the cutting plate 7 has a side cutting edge 59 that extends inclined to the longitudinal axis of the drill shaft 6 which is illustrated in FIG. 5 in side elevation and in FIG. 4 in front view.

We claim:

1. Undercut drill with a mounting arbor, a deflection plate for bearing on a borehole rim and having a stop face and a central axis, said deflection plate having a drill shaft fastened thereto, said drill shaft slanted relative to the central axis of the deflection plate, the drill shaft including a cutting part, characterized in that the mounting arbor is connected with the deflection plate through a cardan joint and the drill shaft includes, on its front end, a cutting plate which protrudes radially.

2. Undercut drill bit according to claim 1, characterized in that the deflection plate is a circular disk tapering toward one side.

3. Undercut drill bit according to claim 1, characterized in that the deflection plate is a circular disk.

4. Undercut drill bit according to claim 2, characterized in that the stop face of the deflection plate is covered with a plastic plate.

5. Undercut drill bit according to claim 1, characterized in that the cardan joint is disposed in a housing, said housing permanently connected with a back side of the deflection plate.

6. Undercut drill bit according to claim 5, characterized in that the housing includes, on the side away from the deflection plate, an opening through which extends a pivotable entrainment screw which is connected with the mounting arbor.

7. Undercut drill bit according to claim 6, characterized in that the entrainment screw includes a hex head having a crowned front face, said head pivotable installed in a hex-shaped recess in the housing and said crowned front face bearing on the rear end of the drill shaft which is fastened in sic the deflection plate.

8. Undercut drill bit to claim 7, characterized in that the hex head is secured to a restoring element.

9. Undercut drill bit according to claim 1, characterized in that the cutting plate includes a directional cutting edge that extends parallel to the longitudinal axis of the drill shaft and is adapted to produce a cylindrical part of a borehole.

10. Undercut drill bit according to claim 1, characterized in that the cutting plate includes a side cutting edge which is slanted with respect to the longitudinal axis of the drill shaft and is adapted to produce a conic undercut of a borehole.

* * * * *

UNITED STATES PATENT AND TRADEMARK OFFICE
CERTIFICATE OF CORRECTION

PATENT NO. : 4,971,486

DATED : November 20, 1990

INVENTOR(S) : Rinklake et al

It is certified that error appears in the above-identified patent and that said Letters Patent is hereby corrected as shown below:

Column 1, line 50, delete "intentionally" and substitute therefor --inventionally--

Column 3, line 2, delete "tapper" and substitute therefor --tapped--

Column 3, line 28, delete "reactionally" and substitute therefor --rotationally--

Column 6, Claim 7, line 9, delete "which is fastened in sic the deflection plate"

Column 6, Claim 8, line 10, after "bit" insert "according"

Signed and Sealed this

Twenty-eighth Day of April, 1992

Attest:

HARRY F. MANBECK, JR.

*Attesting Officer*     *Commissioner of Patents and Trademarks*